United States Patent [19]
Hardin

[11] Patent Number: 5,631,920
[45] Date of Patent: *May 20, 1997

[54] SPREAD SPECTRUM CLOCK GENERATOR

[75] Inventor: Keith B. Hardin, Lexington, Ky.

[73] Assignee: Lexmark International, Inc., Lexington, Ky.

[ * ] Notice: The term of this patent shall not extend beyond the expiration date of Pat. No. 5,488,627.

[21] Appl. No.: 425,832

[22] Filed: Apr. 20, 1995

Related U.S. Application Data

[63] Continuation-in-part of Ser. No. 160,077, Nov. 29, 1993, Pat. No. 5,488,627.

[51] Int. Cl.⁶ .................................................. H03D 1/04
[52] U.S. Cl. .................................. 375/200; 375/375
[58] Field of Search .................................. 375/200, 201, 375/202, 203, 204, 206, 371, 373, 375, 376; 370/18

[56] References Cited

U.S. PATENT DOCUMENTS

| | | | |
|---|---|---|---|
| 3,764,933 | 10/1973 | Fletcher et al. | 331/1 A |
| 3,962,653 | 6/1976 | Basset | 331/2 |
| 4,507,796 | 3/1985 | Stumfall | 375/106 |
| 4,943,786 | 7/1990 | Cordwell et al. | 331/1 A |
| 5,028,887 | 7/1991 | Gilmore | 331/18 |
| 5,272,454 | 12/1993 | Ikai et al. | 332/117 |
| 5,301,367 | 4/1994 | Heinonen | 455/76 |
| 5,329,253 | 7/1994 | Ichihara | 331/17 |

Primary Examiner—Stephen Chin
Assistant Examiner—Kevin Kim
Attorney, Agent, or Firm—John A. Brady

[57] ABSTRACT

A clock circuit includes an oscillator for generating a reference frequency signal, and a spread spectrum clock generator cooperating with the oscillator, generating a spread spectrum clock output signal having a fundamental frequency and reduced amplitude EMI spectral components at harmonics of the fundamental frequency. The spread spectrum clock generator preferably includes a clock pulse generator for generating a series of clock pulses, and a spread spectrum modulator for frequency modulating the clock pulse generator to broaden and flatten amplitudes of EMI spectral components which would otherwise be produced by the clock pulse generator. The spread spectrum modulator frequency modulated the clock pulses with specific profiles of frequency deviation versus the period of the profile. The clock generator circuits are digital and may be reset to a starting condition to synchronize the spread spectrum clock. For a laser printhead, the clock is synchronized with the start-of-sweep signal, so that printing is not degraded.

9 Claims, 5 Drawing Sheets

SPREAD SPECTRUM CLOCK GENERATOR

RELATED APPLICATION

This is a continuation-in-part of U.S. Ser. No. 160,077 filed Nov. 29, 1993 now U.S. Pat No. 5,488,627 and assigned to the same assignee to which this application is assigned. That application is hereby incorporated by reference in full into this application.

FIELD OF THE INVENTION

This invention relates to the field of digital circuits, and more particularly, to a clock circuit having reduced measurable electromagnetic interference (EMI) emissions.

BACKGROUND OF THE INVENTION

Many electronic devices employ microprocessors or other digital circuits which require one or more clock signals for synchronization. A clock signal permits the precise timing of events in the microprocessor, for example. Typical microprocessors may be supervised or synchronized by a free-running oscillator, such as driven by a crystal, an LC-tuned circuit, or an external clock source. Clocking rates up to and beyond 40 MHz are common in personal computers. The parameters of a clock signal are typically specified for a microprocessor and may include minimum and maximum allowable clock frequencies, tolerances on the high and low voltage levels, maximum rise and fall times on the waveform edges, pulse-width tolerance if the waveform is not a square wave, and the timing relationship between clock phases if two-clock phase signals are needed. (See Electronics Engineers' Handbook, by Fink et al., p. 8–111, 1989.)

Unfortunately, high performance, microprocessor-based devices using leading edge, high speed circuits are particularly susceptible to generating and radiating electromagnetic interference (EMI). The spectral components of the EMI emissions typically have peak amplitudes at harmonics of the fundamental frequency of the clock circuit. Accordingly, many regulatory agencies, such as the FCC in the United States, have established testing procedures and maximum allowable emissions for such products. For example, the Commission Electrotechnique International (Comite International Special Des Perturbations Radioelectriques (C.I.S.P.R.)) has guidelines establishing measurement equipment and techniques for determining compliance with regulations. More particularly, for the frequency band of interest to clock circuits, the measured 6 dB bandwidth is a relatively wide 120 KHz.

In order to comply with such government limits on EMI emissions, costly suppression measures or extensive shielding may be required. Other approaches for reducing EMI include careful routing of signal traces on printed circuit boards to minimize loops and other potentially radiating structures. Unfortunately, such an approach often leads to more expensive multilayer circuit boards with internal ground planes. In addition, greater engineering effort must go into reducing EMI emissions. The difficulties caused by EMI emissions are made worse at higher processor and clock speeds.

In certain applications it is necessary to precisely synchronizes the period of one clock with that of another. Accordingly, precise control of the modulation of a clock signal can be significant. In this invention digital spread spectrum modulation circuits are preferably used. These circuits are synchronized by resetting a counter which controls the circuit. Spread spectrum clock implementations employing a voltage controlled oscillator but not digital control are disclosed in U.S Pat. No. 4,507,796 to Stumfall. Digital control circuits of some similarity, not for spread spectrum clock control, are disclosed in U.S. Pat. No. 3,764,933 to Fletcher et al, U.S. Pat. No. 3,962,653 to Basset, 4,943,786 to Cordwell et al, and 5,028,887 to Gilmore. Digital FM communication circuits of some similarity are disclosed in U.S. Pat. No. 5,272,454 to Ikai et al, 5,301,367 to Heinonen, and 5,329,253 to Ichihara.

A digital implementation mentioned beginning at page 19, line 21 in the foregoing parent application, but not shown in the drawing, is now prior art with respect to the filing date of this application. That has data digitally stored which is applied to an adder and accumulated. The output of the accumulator is one input to a phase detector of a phase locked loop, the other input being a divided feedback from the output of the voltage controlled oscillator of the phase locked loop. The output of that oscillator is divided and used as the spread spectrum clock signal.—No disclosed embodiment of this invention employs such an adder or accumulator.

SUMMARY OF THE INVENTION

In view of the foregoing background, it is therefore an object of the present invention to provide a clock circuit and associated method for generating a clock signal, such as for driving a microprocessor or other digital circuit at relatively high frequencies, while reducing the spectral amplitude of EMI components as measured over a relatively large bandwidth.

This and other objects, features, and advantages of the present invention are provided by a clock circuit including an oscillator for generating a reference frequency signal, and spread spectrum clock generating means for generating a spread spectrum clock output signal having a fundamental or center frequency and reduced amplitude EMI spectral components at harmonics of the fundamental frequency. More particularly, the spread spectrum clock generating means preferably includes clock pulse generating means for generating a series of clock pulses, and spread spectrum modulating means for modulating the clock pulse generating means to broaden and flatten amplitudes of EMI spectral components which would otherwise be produced by the clock pulse generating means. A starting point in such modulation is precisely controllable to facilitate synchronization.

The clock pulse generating means, if unmodulated, would typically produce generally rectangular or trapezoidal electrical pulses which, in turn, would generate corresponding impulse-shaped EMI spectral components at harmonics of the fundamental frequency. The spread spectrum modulating means reduces the peak amplitude of the EMI spectral components that would otherwise be produced. Accordingly, expensive shielding or other EMI suppression techniques may be reduced or eliminated in an electronic device including the spread spectrum clock generating circuit of the present invention. As would be readily understood by those skilled in the art, the spread spectrum clock generating circuit may find wide application in a number of electronic devices, particularly those including a microprocessor or microcontroller, such as a personal computer.

The spread spectrum modulating means preferably includes frequency modulating means for frequency modulating the clock pulse generating means. The frequency modulating means, in turn, preferably includes profile modulating means for frequency modulating the clock pulse generating means with a periodic waveform having a predetermined period and a predetermined frequency deviation profile as a function of the predetermined period. Several preferred or effective ranges for such modulating periodic waveforms are described later herein. In general, the preferred waveforms are more complicated than a simple sine wave in order to thereby reduce the spectral peak of EMI components by broadening and flattening their shape.

The clock pulse generating means preferably includes a phase locked loop as is commonly used in a conventional clock generating circuit. The frequency modulation means may be implemented by a programmable modulating generator which can produce a predetermined profile for the frequency deviation. In addition, the frequency modulating means is preferably capable of modulating the clock pulse generating means with a periodic waveform having a period of less than about 500 microseconds, that is, the frequency of modulation is desirably greater than about 2 KHz.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Like numbers refer to like elements throughout.

Figure 1:
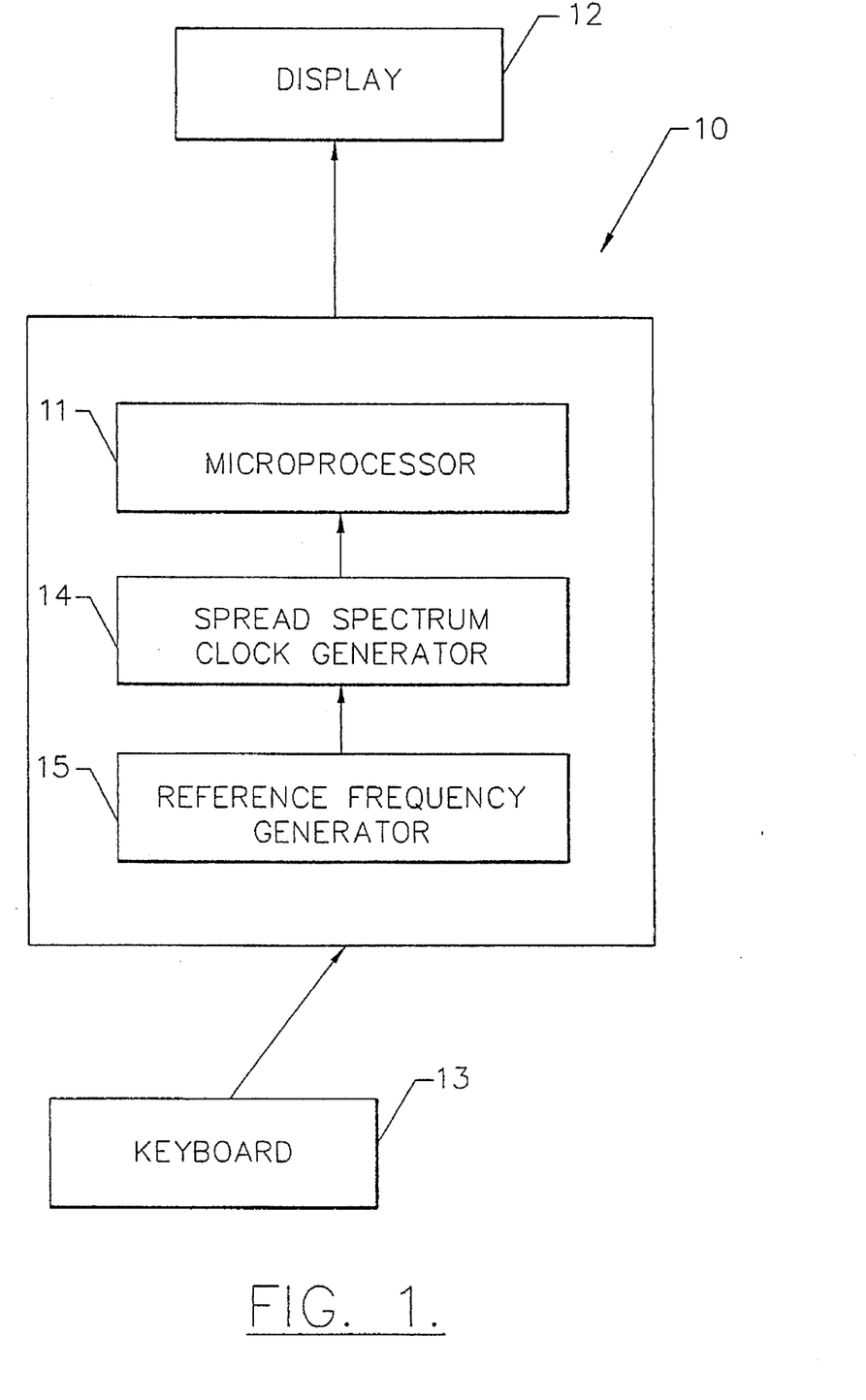
FIG. 1 is a schematic block diagram of a personal computer including a spread spectrum clock generating circuit in accordance with the invention.

Referring first to FIGS. 1 through 5, an electronic device incorporating the spread spectrum clock generating circuit and its basic operation are first explained, As shown in FIG. 1, an electronic device, such as the schematically illustrated personal computer 10, may benefit by having reduced measurable EMI spectral component emissions provided by the spread spectrum clock generator 14 (SSCG) according to the invention. A reference frequency generator 15, such as a piezoelectric crystal driven at its resonant frequency by a suitable driver or oscillator circuit, provides a reference frequency for the SSCG14. The illustrated personal computer 10 also includes a display 12 and a keyboard 13.

As would be readily understood by those of skill in the art, a number of electronic devices incorporating microprocessors or other digital circuits requiring a clock signal for synchronization may also desirably incorporate the SSCG14. For example, computer printers may also desirably include the SSCG 14.

Figure 2:
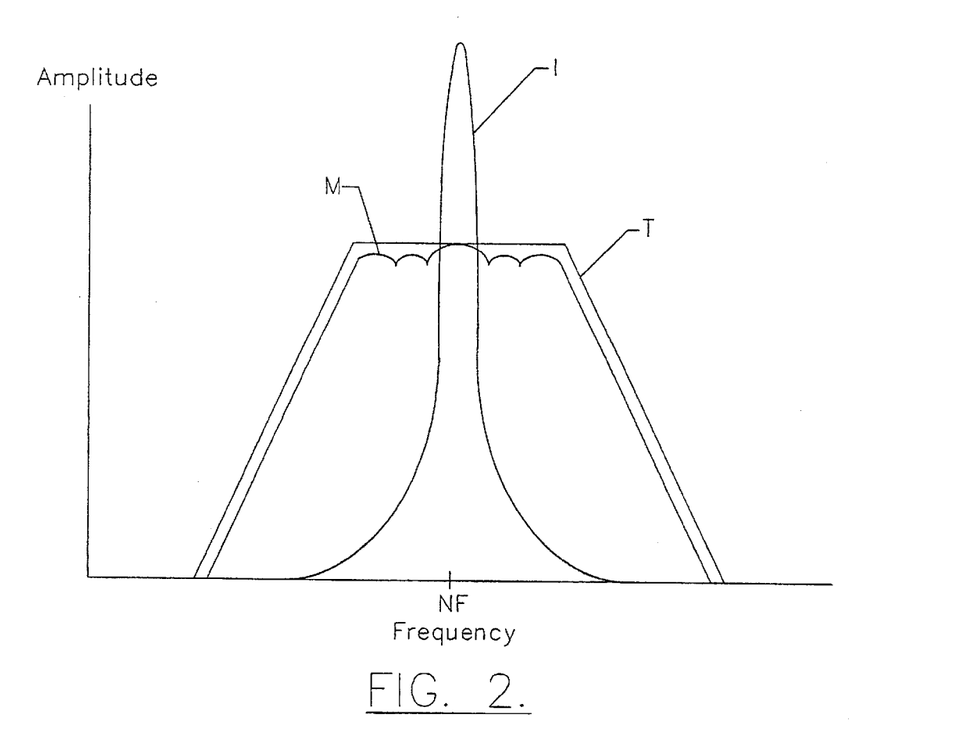
FIG. 2 is a graph illustrating a reduction of peak spectral amplitude of a harmonic of the clock fundamental frequency produced by the spread spectrum clock generating circuit in accordance with the present invention.

The SSCG 14 generates the spread spectrum output clock signal by frequency modulating a typical clock signal including a series of trapezoidal or generally rectangularly-shaped electrical clock pulses. The modulation reduces the spectral amplitude of the EMI components at each harmonic of the clock when compared to the spectrum of the same clocking signal without modulation. FIG. 2 is a schematic representation of this effect where the spectral amplitude versus frequency at a harmonic (NF) is indicated by the plot labelled M. As also shown, the spectrum at the same harmonic of a standard clock signal is given as an impulse function labelled I. The spectrum of the SSCG output clock signal at the same harmonic ideally assumes a trapezoidal shape as illustrated by the plot labelled T.

Although in general the spectral "width" of the spread spectrum output clock signal at a harmonic is greater that the width of the standard non-modulated clock signal, the maximum amplitude for the harmonic is reduced, In an actual implementation, the amplitude of the spread spectrum modulated harmonic will not be uniform, but will exhibit some peaking near the center frequency and at the edges as illustrated by the plot M.

In order to minimize the amplitude of the signal for all frequencies, the modulation of the standard clock signal must by uniquely specified, Accordingly, the SSCG 14 includes profile modulation means for frequency modulating the clock pulse generating means with a periodic waveform having a predetermined period and a predetermined frequency deviation profile as a function of the predetermined period. The modulation profiles described herein produce relatively optimized flat spectral amplitudes at each harmonic, In general, the preferred profiles are more complicated that a simple sine wave in order to thereby reduce the measurable spectral peaks of the EMI components. Stated in other terms, the present invention converts narrow band harmonics into broadband signals that significantly reduce the measured emissions for the FCC and other regulatory bodies worldwide. These emission reductions may permit corresponding cost reductions of about $20 or more per product, as compared to the cost of conventional measures to suppress or shield EMI emissions.

Figure 3:
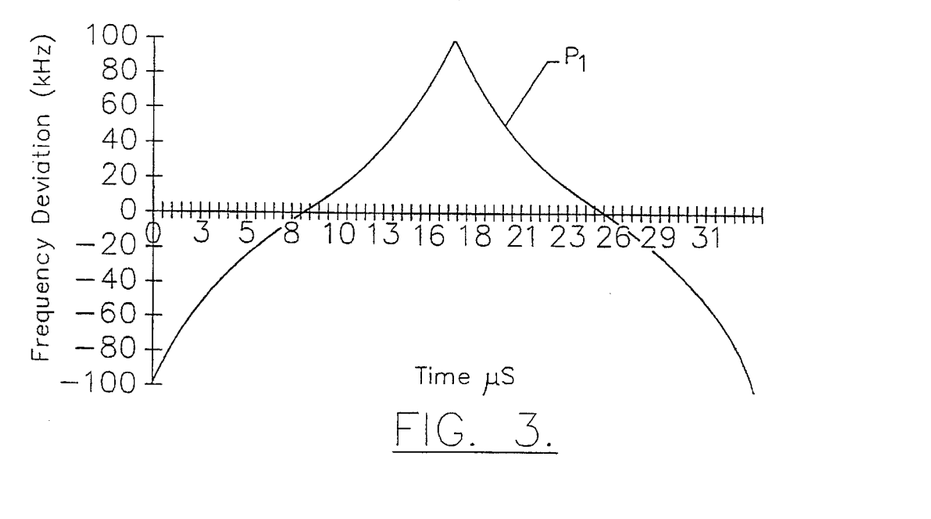
FIG. 3 is a graph illustrating an embodiment of a desired modulation profile for producing a spread spectrum modulated clock signal in accordance with the present invention.

FIG. 3 illustrates a typical profile of the frequency deviation versus time as may be used within the SSCG 14. The maximum deviation illustrated is 100 KHz. This maximum frequency deviation is desirably programmable via a serial link with an upper limit of the maximum deviation being preferably about 250 KHz for typical current applications. However, depending on the application, the maximum deviation may be much greater that 250 KHz as would be readily understood by those skilled in the art. As would be also readily understood by those skilled in the art, a standard, non-modulated clock signal may be obtained by programming the maximum deviation to 0.

The frequency of the signal modulating the profile shown in FIG. 3 is 30 KHz. Significant peak amplitude reduction may also be achieved where the frequency is above 2 KHz, that is, where the period of the modulating waveform or profile is less than about 500 microseconds. This frequency is also desirably programmable via the serial link or may be fixed dependent on the application. The modulating profile illustrated is a linear combination of a standard triangular wave and its cubic. The values of the profile are given in TABLE 1 of the foregoing related application of which this application is a continuation-in-part.

Figure 4:
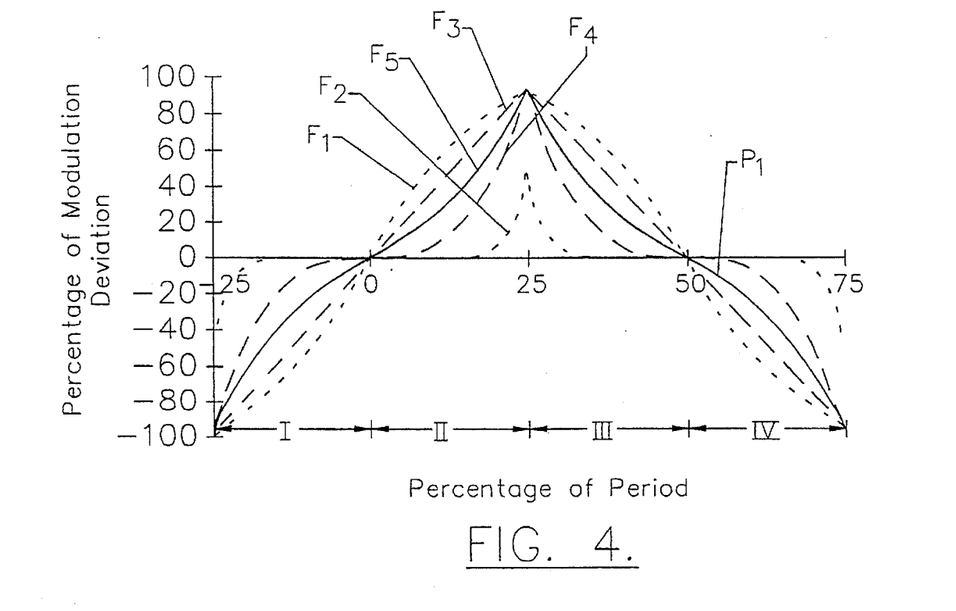
FIG. 4 is a graph illustrating several modulation profile ranges for producing a spread spectrum modulated clock output signal in accordance with the present invention.

Referring now more particularly to FIG. 4, several preferred ranges of profiles of frequency deviation are illustrated. In particular, the profiles are expressed as a percentage of frequency deviation versus a percentage of the period (% Period) of the periodic waveform. The outermost range or envelope is illustrated by the dotted lines labelled $F_1, F_2$ in the second quadrant II, that is, between 0% and 25% of the period. Straightforward symmetry defines the boundaries in the other indicated quadrants as described. Accordingly, those of skill in the are may readily implement and scale the ranges for a desired application.

The dotted lines may be defined mathematically by predetermined upper and lower bounds for the second quadrant II. The upper bound $F_1$ is defined by $$100\% \left( -1 + \sqrt{ -\left( \frac{\% \text{ period}}{25} \right)^2 + 4\left( \frac{\% \text{ period}}{25} \right) + .973 } \right),$$

while the lower bound $F_2$ is defined by $$50\% \left( \frac{\% \text{ period}}{25} \right)^{10}.$$

As would be readily understood by those skilled in the art, the boundaries for the other quadrants defined by $F_1$ and $F_2$ as follows:

Quadrant I (−25% to 0% Period):
  Lower bound=−$F_1$ (−% Period),
  Upper bound=−$F_2$ (−% Period);
Quadrant III (25% to 50% Period):
  Lower bound=$F_2$ (50−% Period),
  Upper bound=$F_1$ (50−% Period);
Quadrant IV (50% to 75% Period):
  Lower bound=−$F_1$ (% Period−50)
  Upper bound=−$F_2$ (% Period−50).

A more preferred profile range is indicated by the dashed lines indicated in FIG. 4. In quadrant II, this profile is defined by an upper bound $F_3$ and a lower bound $F_4$. The upper bound $F_3$ is defined in quadrant II by $$100\% \left( \frac{\% \text{ period}}{25} \right),$$

and the lower bound is defined in quadrant II by $$100\% \left( \frac{\% \text{ period}}{25} \right)^3.$$

Accordingly, the other boundaries are given by:
Quadrant I (−25% to 0% Period):
  Lower bound=−$F_3$ (−% Period),
  Upper bound=−$F_4$ (−% Period);
Quadrant III (25% to 50% Period):
  Lower bound=$F_4$ (50−% Period),
  Upper bound=$F_3$ (50−% Period); and
Quadrant IV (50% to 75% Period):
  Lower bound=−$F_3$ (% Period−50)
  Upper bound=−$F_4$ (% Period−50).

As also shown in FIG. 3, the solid line $P_1$ of FIG. 4 illustrates the linear combination of a triangular waveform and its cubic. More particularly, this profile is defined quadrant II by $F_5$ which is equal to $$100\%[0.45(\% \text{ Period}/25)^3 + 0.55(\% \text{ Period}/25)].$$

Accordingly, the solid line is defined in the other quadrants as follows:
Quadrant I (−25% to 0% Period):
  −$F_5$ (−% Period);
Quadrant III (25% to 50% Period):
  $F_5$ (50−% Period); and
Quadrant IV (50% to 75% Period):
  −$F_5$ (% Period−50)

Figure 5:
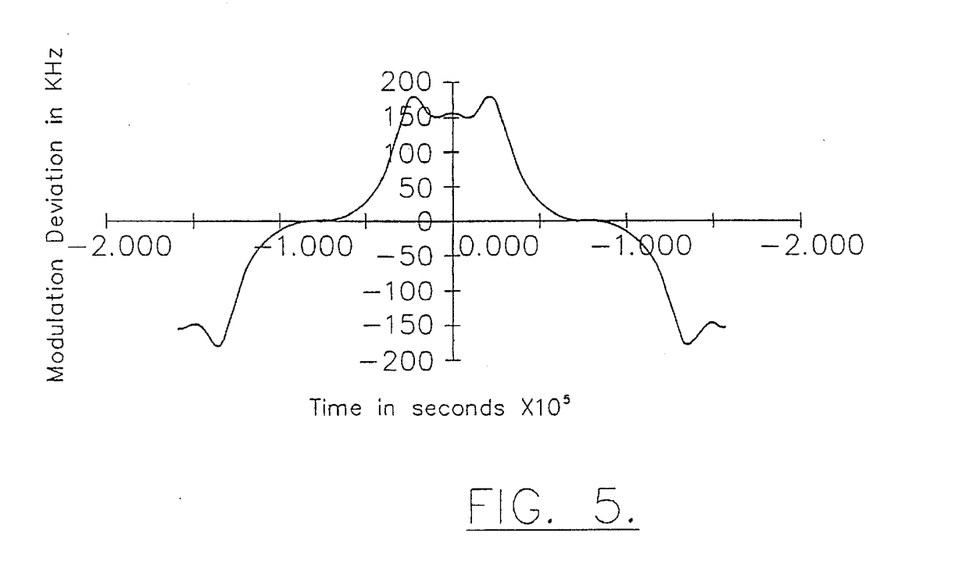
FIG. 5 is a graph illustrating yet another embodiment of a desired modulation profile for producing a spread spectrum modulated clock output signal in accordance with the present invention.

FIG. 5 illustrates yet another embodiment of a profile for the frequency deviation modulation which may be scaled to fit within the outermost profile defined by $F_1$ and $F_2$ as would be readily appreciated by those of skill in the art.

Figure 6:
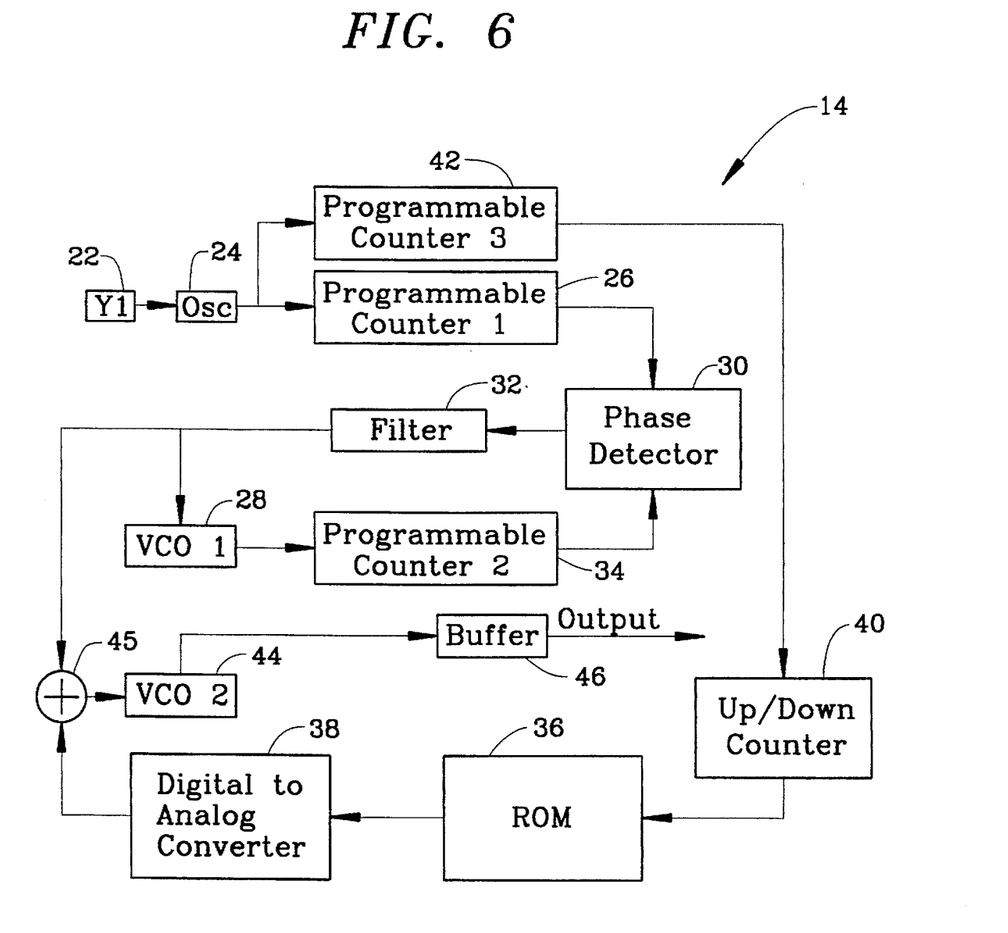
FIG. 6 is a schematic block diagram illustrating a circuit embodiment for producing the precisely controlled spread spectrum modulated clock output signal in accordance with the present invention.

Referring now to FIG. 6 a circuit embodiment for the SSCG 14 is described. The block diagrams are similar to several conventional phase locked loop (PLL) frequency synthesizer chips; however, a modulation section is added which includes a programmable modulation generator in several embodiments, or an analog modulation generator in other embodiments. The modulation is fed into a voltage controlled oscillator (VCO) or oscillator tank circuit to give the desired modulation index.

The SSCG 14 may desirably be programmable via an $I^2$C serial bus or select lines to allow variation of the center frequency, maximum frequency deviation and modulation frequency. A single +5 V supply, minimal external circuitry and a crystal will produce a TTL and CMOS compatible output with controlled rise and fall times. In addition, all inputs are standard TTL compatible.

The following electrical characteristics (TABLE 2) and switching characteristics (TABLE 3) given below are also desirably met by the embodiments of the SSCG 14 to be compatible with conventional digital circuits or microprocessors clock input requirements.

TABLE 2

Electrical Characteristics

| Characteristic | Symbol | Min | Typ | Max | Units |
|---|---|---|---|---|---|
| Load Capacitance | $C_L$ | — | 30 | 50 | pF |
| Quiescent Supply Current | $I_{cc}$ | — | — | 45 | mA |

TABLE 3

Switching Characteristics

| Characteristic | Symbol | Min | Typ | Max | Units |
|---|---|---|---|---|---|
| Output Rise (0.8 to 2.0 V) and Fall Time (2.0 V to 0.8 V) | $t_{TLH}, t_{HL}$ | 1 | 2 | 3 | ns |
| Maximum Frequency Deviation* | $\Delta F_{max}$ | 0 | 100 | 250 | KHz |
| Modulating Frequency* | $F_{mod}$ | 15 | 30 | 50 | KHz |

*Programmable via serial link.

Referring now to FIG. 6, Y1 22 is a piezoelectric crystal used with an oscillator circuit 24 to generate a stable clock pulse train or unmodulated clock signal. A first programmable counter 26 divides the unmodulated clock signal by an integer number (M). A voltage controlled oscillator 28 (UCO) generates an output clock signal that is proportional to the input voltage from the phase detector 30 through filter 32.

A second programmable counter 34 divides the signal from VCO 28 by an integer number (N). Counters 26 and 34 are the two inputs to phase detector 30. Phase detector 30 and filter 32 generate an analog signal that is proportional to the errors in phase between first and second programmable counters 26, 34 respectively. Accordingly, the output for phase detector 30 and filter 32 each represents the oscillator 24 frequency times N/M; When N and M are constant, as they are in the embodiment of FIG. 6, VCO 28 is operated as in a standard phase locked loop circuit.

The spread spectrum modulation is introduced in this embodiment by a ROM 36 having stored therein modulation variation values that are fed into a digital to analog convertor (DAC) 38. An up/down counter 40 is used to index the value of ROM 36 while a third programmable counter 42 sets the modulation frequency.

A second voltage controlled oscillator 44 receives from adder 45 an input of the constant output from filter 32 combined with plus the input from DAC 38, which varies the frequency of VCO 44 according to the changes in input from DAC 38. VCO 44 is connected through buffer 46 as the spread spectrum clock output.

It will be apparent that the modulation can be brought to a known condition by setting up/down counter 40. Thus, by resetting counter 40, the input to VCO 44 represents that for the start of a cycle and VCO 44 promptly adjusts to provide a corresponding frequency.

Figure 7:
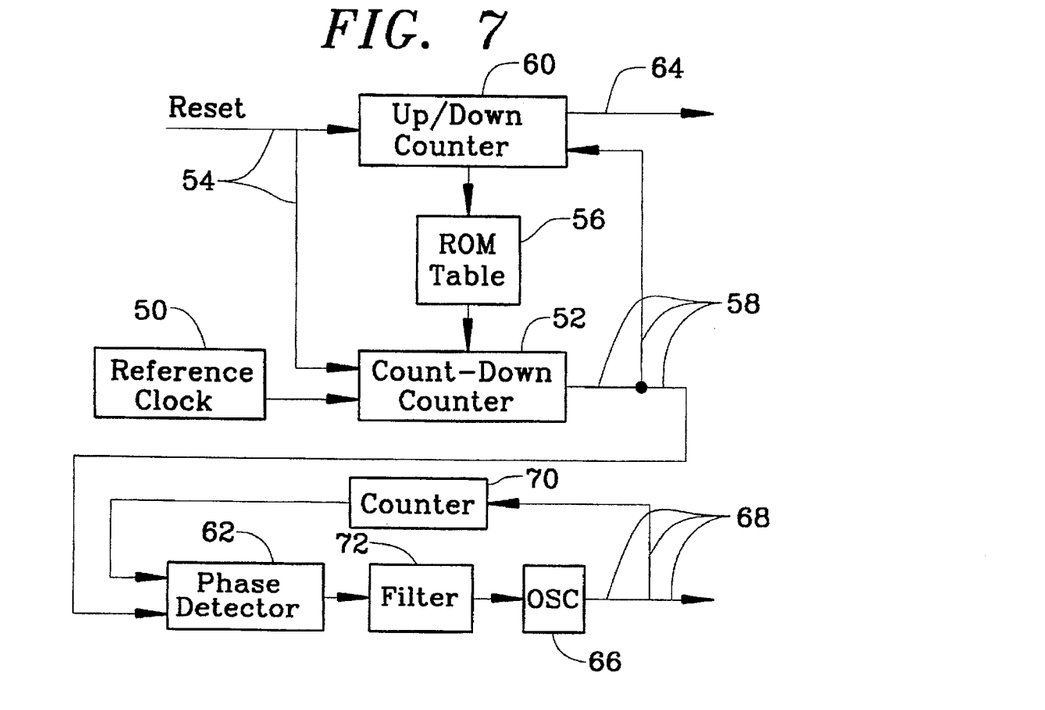
FIG. 7 is a schematic block diagram illustrating another embodiment for producing a precisely controlled spread spectrum modulated clock output signal in accordance with the present invention.

A second implementation circuit suitable for synchronization is shown in FIG. 7. Element 50 is a reference frequency clock, which may be identical to the combination of elements 22 and 24 in the FIG. 6 embodiment. Clock 50 serves as a clock input to count-down counter 52. A second input on line 54 to counter 52, is a reset input.

Counter 52 receives number data from ROM table memory 56, which data is counted down once with each clock signal from clock 50 until counter 52 reaches zero and produces a signal on output line 58. That signal on line 58 is an input signal to up/down counter 60 and phase detector 62.

Each count change of counter 60 produces a different output, which changes the address to ROM table 56 and thereby applies the count data at that address to counter 52, to again begin a count down to zero by counter 52. Separately, when counter 60 is reset by a signal on line 54, it produces a signal on line 64 suitable as a reset signal of another spread spectrum clock circuit, which may be identical to that of FIG. 7.

Phase detector 62 and the remaining elements of FIG. 7 are a standard phased locked loop. The second input to phase detector 62 is the output of voltage controlled oscillator 66 on line 68 divided by an integral number by a counter 70. Phase detector 62 produces a signal proportional to the time difference between leading edges of the signal on line 58 and the signal from counter 70. This output is smoothed by filter 72, as is conventional.

Summarizing the operation, reference clock 50 steps down counter 52, which has been loaded by ROM table 56. Thus, the number from table 56 defines a delay before counter 52 reaches zero and issue a signal on line 58. That signal is one input to phase detector 62, while a divided feedback from the output 68 of the phased locked loop is the other.

The signal from counter 52 on line 58 also steps up/down counter 60. The next status of counter 60 define an output which selects the next location in ROM table 56, thereby entering a different number in counter 52. When subsequent clock pulses decrement the new count in counter 52 to zero, the next signal is issued on line 58 and the operations just recited are repeated.

Assuming that the desired changes in frequency are not rapid and filter 72 readily passes changes corresponding to the frequency of those changes, the content of ROM table 56 can directly correspond to the desired change. A very simplified and illustrative content might be 17 followed by 14, followed by 10, followed by 6, followed by 3, followed by 0. These are addressed as counter 60 increases from 0 (which addresses the 17) to 5 (which addresses the 0), after which counter 60 would decrement on the next count, so that the next count is 4 (which addresses the 3).

The interplay between the phase locked loop 62, 72, 66, and 70 to the content of the ROM table 56 may be optimized in various ways. If the inputs on line 58 may be relatively frequent with respect to the frequency band which filter 72 passes, than the output does not closely follow individual changes. In that event the number contents in ROM table 56 might differ somewhat in order to achieve the desired output through filter 72, although the gross change in numbers in ROM table 56 would continue to correspond to the desired spread spectrum pattern. In such event the specific numbers in ROM table 56 will be best determined empirically.

Synchronization

In certain applications the clock timing may vary provided certain functions are synchronized to that varying pattern. In a laser printer, a laser beam is swept across a photoconductor as it is pulsed or not pulsed at the clock times. Those clock times may be in a spread spectrum without significant degradation of the printing if each sweep is synchronized to the same point in the spread spectrum. A similar problem exists for video displays created by electron beam sweep or similar sweeping.

The reset input on line 54 provides such synchronization. A start-of-sweep signal is conventionally available from a laser printhead (conventionally termed HSync). This HSync signal is applied to the 54. That signal resets counter 60 and counter 52 to zero. This immediately brings the frequency of pulses on line 58 to that defined by the counter 60 being zero and then being stepped as described. Phase detector 62 immediately begins to change the frequency of VCO 66 if the other input to phase detector 62 represents a different phase. The resetting of counter 60 produces a signal on line 64, which can reset a second spread spectrum clock circuit so that the two spread spectrum clock circuit are synchronized with themselves and with the input on the line 54.

Figure 8:
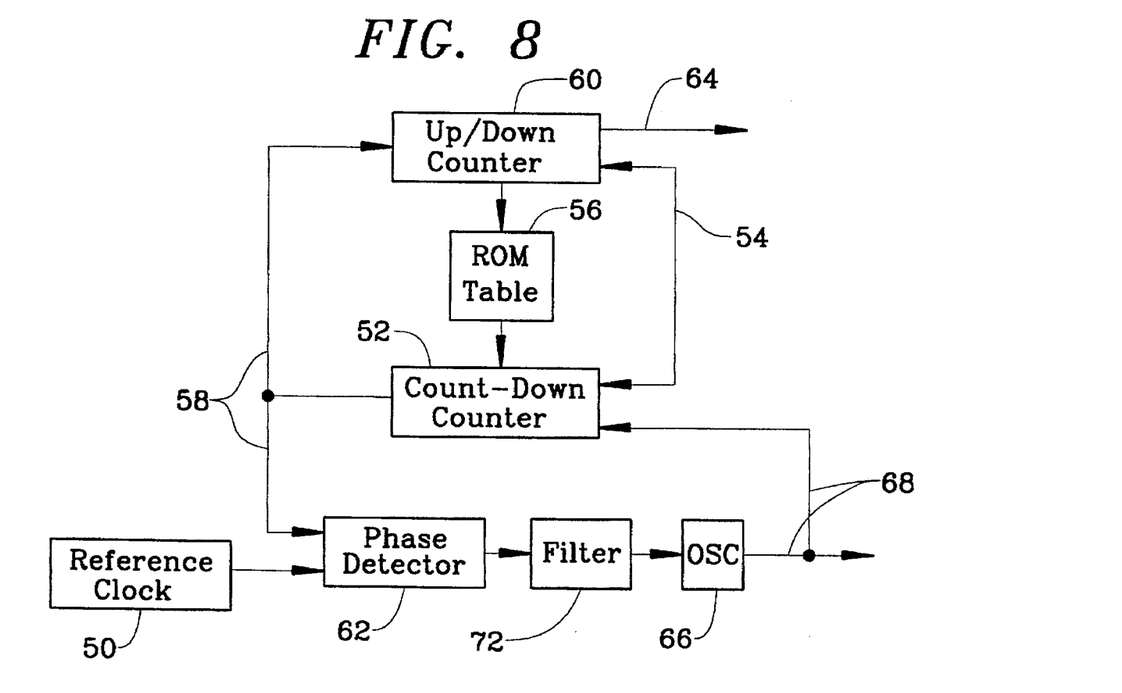
FIG. 8 is a variation of the circuit of FIG. 7 eliminating one counter.

FIG. 8 is an alternative embodiment which eliminates the counter 70. Other elements are numbered the same as the corresponding element in FIG. 7, as the other difference is in the content of ROM table 56. Since the reference clock is one of the two inputs to phase detector 62, the content of ROM table 56 must be adjusted accordingly. In practice, the exact content of ROM table 56 will be best determined empirically.

As would be readily understood by those skilled in the art, in an implementation of any of the circuits described herein in a physical package, several such spread spectrum clock generating circuits (SSCG's) may be found in the same DIP. In addition, a standard phase locked loop frequency synthesizer may also be located in the same DIP to provide standard clock signals, if desired, The SSCG may also be included internally with a microprocessor or any other digital or analog circuit.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed:

1. A clock controlled electronic device having a clock to provide spread spectrum clock signals to said device, said spread spectrum clock comprising a reference frequency clock, a stored table of digital values, a counter to address said table at different counts of said counter counting signals from said reference frequency clock, a voltage controlled oscillator having a control input, means to receive said stored digital values addressed by said different counts of said counter and to convert said received digital values to control signals to said input of said voltage controlled oscillator, the output of said voltage controlled oscillator providing said spread spectrum clock signals to said device.

2. The clock controlled device as in claim 1 also comprising a reset input to said counter to receive a reset signal to synchronize said spread spectrum clock signal with said reset signal.

3. The clock controlled device as in claim 1 also comprising a phase locked loop, a second counter counting signals from said reference frequency clock and providing a control input to said phase locked loop, and means to combine a signal from said phase locked loop and a signal defined by said received digital values, and to provide said combined signals as said control signal to said voltage controlled oscillator.

4. A clock controlled electronic device having a clock to provide spread spectrum clock signals to said device, said spread spectrum clock comprising a reference frequency clock, a stored table of digital values, a first counter to address said table at different parts of said table determined by different counts of said first counter, a second counter to receive said stored digital values addressed by said different counts of said first counter, said second counter being responsive to clock signals of said reference frequency clock to step said second counter after said second counter receives each said digital value, a phase detector responsive to the difference in phase of two inputs to produce an output representative of the phase difference of said two inputs of said phase detector, said second counter providing an output signal upon reaching a predetermined value, said output signal providing a control signal to step the count of said first counter and said output signal providing one input to said phase detector, a voltage controlled oscillator having an input receiving said output of said phase detector and an output providing the second input of said phase detector to form a phase locked loop, the output of said phase locked loop providing said spread spectrum clock signals to said device.

5. The clock controlled device of claim 4 also comprising a reset input to said first counter and to said second counter to receive a reset signal to synchronize said spread spectrum clock signal with said reset signal.

6. The clock controlled device of claim 5 in which said second counter receives said reference frequency clock signals and said one input of said phase detector is provided by said second counter reaching a predetermined value.

7. The clock controlled device of claim 5 in which, in addition to said reset input to said first counter and to said second counter, the input of said second counter is connected to said output of said voltage controlled oscillator and the output of said second counter is connected as said second input of said phase detector, and said reference frequency clock signals are connected to provide said one input of said phase detector.

8. The clock controlled device of claim 4 in which said second counter receives said reference frequency clock signals and said one input of said phase detector is provided by said second counter reaching a predetermined value.

9. The clock controlled device of claim 4 in which the input of said second counter is connected to said output of said voltage controlled oscillator and the output of said second counter is connected as said second input of said phase detector, and said reference frequency clock signals are connected to provide said one input of said phase detector.

* * * * *